US006369556B2

(12) United States Patent
Ohshima

(10) Patent No.: US 6,369,556 B2
(45) Date of Patent: Apr. 9, 2002

(54) POWER SUPPLY CONTROL DEVICE AND METHOD

(75) Inventor: Shunzou Ohshima, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/774,704

(22) Filed: Feb. 1, 2001

(30) Foreign Application Priority Data

Feb. 2, 2000 (JP) ........................................ 2000-025572

(51) Int. Cl.[7] .................................................. G05F 1/40
(52) U.S. Cl. ...................................... 323/282; 323/285
(58) Field of Search ................................ 323/282, 285, 323/315, 907

(56) References Cited

U.S. PATENT DOCUMENTS

| 5,796,278 A | * | 8/1998 | Osborn et al. ............... 327/108 |
| 5,861,737 A | * | 1/1999 | Goerke et al. ............... 323/282 |
| 6,222,355 B1 | * | 4/2001 | Ohshima et al. ............ 323/282 |
| 6,304,066 B1 | * | 10/2001 | Wilcox et al. ............... 323/282 |

FOREIGN PATENT DOCUMENTS

| JP | 3-143221 | 6/1991 | .......... H02H/3/087 |
| JP | 5-52880 | 3/1993 | .......... G01R/19/165 |

OTHER PUBLICATIONS

Patent Abstract of Japan, 05–052880, Mar. 2, 1993.

* cited by examiner

*Primary Examiner*—Peter S. Wong
*Assistant Examiner*—Gary L. Laxton
(74) *Attorney, Agent, or Firm*—Sughrue Mion, PLLC

(57) ABSTRACT

When the supply of electric power from a power supply (101) to a load (102) is controlled in a switching manner by a semiconductor switch (QA), reference current generating device (R11, Q2, Q3) generates a reference current, and reference voltage generating device (QB) generates a reference voltage (VDSB) based on the reference current. Detector CMP1 detects a difference between a terminal voltage (VDSA) of the semiconductor switch (QA) and the reference voltage, and the semiconductor switch (QA) is on/off controlled in accordance with the difference between the terminal voltage (VDSA) of the semiconductor switch (QA) and the reference voltage.

14 Claims, 8 Drawing Sheets

POWER SUPPLY CONTROL DEVICE AND METHOD

BACKGROUND OF THE INVENTION

1. Field of the Invention

The present invention relates to a power supply control device and method. More particularly, the invention relates to a power supply control device having a semiconductor switch which is controlled in accordance with a control signal supplied to a control signal input terminal to control the supply of electric power from a power supply to a load under the switching control, and a power supply control method in use for the power supply control device.

2. Related Art

The power supply control device with a semiconductor device, which arranged as shown in FIG. 8 is known. This power supply control device, which is used in a vehicle, selectively supplies electric power source from a battery to respective loads, and controls the power supply to the load.

As shown, the related power supply control device is arranged such that a shunt resistor RS and a drain (D)—source (S) path of a thermal FET QF are connected in series in a power supply path for supplying an output voltage VB of a power supply 101 to a load 102 including headlights, power windows and others. The power supply control device includes a driver 901 which detects a current flowing through the shunt resistor RS and controls the drive of the thermal FET QF by a hardware circuit, an A/D converter 902 for translating the analogue value of a current monitored by the driver 901 into the digital value, and a microcomputer (CPU) 903.

The thermal FET QF is contained with a thermosensor (not shown). The thermal FET QF as a semiconductor switch has an overheat shut-off function to forcibly shut off the thermal FET QF by a gate shut-off circuit contained therein when temperature of the thermal FET QF rises in excess of a predetermined temperature. In the figure, RG is a resistor, and ZD1 is a Zener diode which keeps the voltage between the gate G and the source S of the thermal FET QF at 12V, and when overvoltage is applied to the gate G of the FET, forms a bypass for a current caused by the overvoltage.

This related power supply control device has a protecting function against an over current flowing through the load 102 or the drain-source path of the thermal FET QF. The driver 901 includes differential amplifiers 911 and 913, which serves as a current monitoring circuit, a differential amplifier 912 as a current restricting circuit, a charge/pump circuit 915, and a drive circuit 914 which drives the gate G of the thermal FET QF through the resistor RG based on an on/off control signal from the microcomputer (referred to as MICROCOMPUTER) 903 and the overcurrent judgement result output from the current restricting circuit.

When the differential amplifier 912 judges on a voltage drop through the shunt resistor RS that the current exceeds a reference value (upper limit), viz., it detects overcurrent, the drive circuit 914 turns off the thermal FET QF. Thereafter, when the current decreases to below another reference value (lower limit), it turns on the FET again.

The MICROCOMPUTER 903 monitors the current by the current monitor circuit (differential amplifiers 911 and 913) at all times. When an abnormal current in excess of a normal value flows, the MICROCOMPUTER 903 stops the drive current for the thermal FET QF to turn off the FET. When temperature of the thermal FET QF exceeds a prescribed value before a drive signal for the off control is output from the MICROCOMPUTER 903, the overheat shut-off function operates to turn off the thermal FET QF.

The related power supply control device mentioned above needs the shunt resistor RS connected in series to the power supply path, in order to make the current detection. In the recent trend of large load currents, which induces reduction of the resistance of the thermal FET QF, the heat loss by the shut resistor is not negligible.

The overheat shut-off function and the overcurrent restricting circuit operate when an almost perfect short occurs in the load 102 or the wiring, and large current flows. However, those fail to operate when a layer short, e.g., an imperfect short having some short resistance, occurs and small short current flows. A possible measure taken for the layer short is that the MICROCOMPUTER 903 detects an abnormal current by only using the monitor circuit and turns off the thermal FET QF. A response of the MICROCOMPUTER basis control to such an abnormal current is poor.

Since the shunt resistor RS, the MICROCOMPUTER 903 and the like are indispensably used in the related power supply control device, a large packaging space is required. Additionally, those part and component are relatively expensive, so that the resultant device is high in cost.

SUMMARY OF THE INVENTION

Accordingly, the present invention is directed to solve the above problems and to eliminate the inconvenient circumstances, and has an object to provide a power supply control device and method which eliminates the shunt resistor connected in series to the power supply path in order to detect the current, thereby repressing the heat loss, quickly responses to an abnormal current flowing when a layer short, e.g., an imperfect short having some resistance, occurs, and is easy to integrate and is low in cost.

According to the present invention, there is provided a power supply control device comprising: a semiconductor switch being controlled in accordance with a control signal supplied to a control signal input terminal to control the supply of electric power from a power supply to a load under the switching control; a reference current generating device for generating a reference current; a reference voltage generating device for generating a reference voltage based on the reference current; a detector for detecting a difference between a voltage between terminals of the semiconductor switch and the reference voltage; and a controller for on/off controlling the semiconductor switch in accordance with a detected difference between the terminal-terminal voltage and the reference voltage.

In the power supply control device, the reference voltage generating device includes a second semiconductor switch controlled in accordance with the control signal, and the second semiconductor is connected in series to the reference current generating device to form a series circuit, which is connected in parallel to the semiconductor switch and the load, whereby the terminal-terminal voltage of the second semiconductor switch is generated in the form of the reference voltage.

In the power supply control device, the reference current generating device generates a reference current dependent on an output voltage of the power supply.

In the power supply control device, the reference current generating device is a constant current source.

In the power supply control device, a voltage characteristic of the reference voltage of the reference voltage generating device is substantially equal to a voltage characteristic in a state that a target current flows, which is in excess of a maximum current within a range where the semiconductor switch and the load are normally operable.

In the power supply control device, the semiconductor switch and the second semiconductor switch are equivalent to each other in a transient voltage characteristic of the terminal-terminal voltage when each semiconductor switch shifts its state from an off state to an on state.

The power supply control device further includes overheat protector operating such that when the semiconductor switch is overheated, the overheat protector turns off the semiconductor switch, to thereby protect the semiconductor switch.

In the power supply control device, the semiconductor switch, the reference voltage generating device, the detector, the controller, and the overheat protector are formed on a same chip.

In the power supply control device, the reference current generating device is located outside the chip.

The power supply control device further comprises prohibiting device for prohibiting the controller from turning on and off the semiconductor switch for a fixed period after the semiconductor switch is turned on.

The power supply control device further includes number-of-times controller operating such that the number-of-times controller adds up the number of times the controller turns on and off the semiconductor switch, and when the number of on/off control times reaches a predetermined number of times, the number-of-times controller turns off the semiconductor switch.

According to the present invention, there is provided a power supply control method in use for a power supply control device including a semiconductor switch which is controlled in accordance with a control signal supplied to a control signal input terminal to control the supply of electric power from a power supply to a load under the switching control, the power supply control method comprising the steps of: generating a reference current; generating a reference voltage based on the reference current; detecting a difference between terminals of the semiconductor switch and the reference voltage; and on/off controlling the semiconductor switch in accordance with a detected difference between the terminal-terminal voltage and the reference voltage.

In the power supply control devices and in the power supply control method, when the supply of electric power from the power supply to the load is controlled by the semiconductor switch in a switching manner, a reference current is generated by the reference current generating device (reference current generating step). A reference voltage is generated based on the reference current by the reference voltage generating device (reference voltage generating step). A difference between the voltage between terminals of the semiconductor switch and the reference voltage is detected by the detector (detecting step) The semiconductor switch is on/off controlled in accordance with the detected voltage difference between the terminal-terminal voltage and the reference voltage by the controller (control step).

The semiconductor switch (second and third semiconductor switches to be described later) may be any of the following switching elements: field effect transistors (FETs) and static induced transistor (SITs), or emitter switched thyristors (ESTs), MOS complex devices, e.g., MOS controlled thyristors (MCTs), and insulated gate power devices, e.g., IGBT (insulated gate bipolar transistors. Those switching elements may be of the n-channel type or the p-channel type.

In particular, in the power supply control device, it is preferable that the reference voltage generating device includes a second semiconductor switch controlled in accordance with the control signal. Further, the second semiconductor is connected in series to the reference current generating device to form a series circuit. The series circuit is connected in parallel to the semiconductor switch and the load. The terminal-terminal voltage of the second semiconductor switch is generated in the form of the reference voltage. It is desirable that the reference current generating device, as in the third power supply control device, generates a reference current dependent on an output voltage of the power supply, or that it is a constant current source, as in the fourth power supply control device.

In the power supply control device, it is desirable that a voltage characteristic of the reference voltage of the reference voltage generating device is substantially equal to a voltage characteristic in a state that a target current flows, which is in excess of a maximum current within a range where the semiconductor switch and the load are normally operable. In the sixth power supply control device, it is desirable that the semiconductor switch and the second semiconductor switch are equivalent to each other in a transient voltage characteristic of the terminal-terminal voltage when each semiconductor switch shifts its state from an off state to an on state.

In a case where an FET is used for the semiconductor switch, the terminal-terminal voltage (between the drain and the source) of the FET forming a part of the power supply path varies depending on states of the power supply path and the load, viz., a time constant defined by wiring inductance and resistance of the path and short resistance, in the voltage characteristic when the FET shifts its state from an on state to an off state (the descending voltage characteristic in the case of the n-channel FET). In a normal operation where no short occurs, the terminal-terminal voltage swiftly converges to a voltage value below a reference voltage value. Where a short occurs, it does not converge to below the reference voltage value. Where an imperfect short having some resistance occurs, it takes a long time till the terminal-terminal voltage converges to below the reference voltage value.

The present invention utilizes the transient voltage characteristic of the semiconductor switch when it shifts its state from an off state to an on state. In the invention, judgement is made as to whether or not the terminal-terminal voltage of the semiconductor switch (or the current in the power supply path), which forms a part of the power supply path, is out of a normal state by detecting a difference between the terminal-terminal voltage of the semiconductor switch and the reference voltage generating device (reference voltage generating step). Overcurrent can be detected by the detector (detecting step) if the voltage characteristic of the reference voltage is set to bear a closest resemblance to the voltage characteristic in a state that a target current, which is in excess of the maximum current within a normal operation range, flows to the load.

Therefore, the power supply control device and method of the invention does not need the shunt resistor, conventionally used, which is connected in series to the power supply path for the current detection. With this feature, the heat loss of the device is suppressed. An abnormal current by a layer short, such as an imperfect short having some short resistance, as well as an overcurrent by a perfect short, can continuously be detected by use of the hardware circuit or the program processing by the MICROCOMPUTER or the like. Further, the overcurrent can be detected without the shunt resistor. Particularly, when the on/off control process for the semiconductor switch is realized by a hardware circuit, there is no need of using the MICROCOMPUTER. This feature brings about the packaging space reduction, and considerable reduction of the device cost.

In a case where, as in the power supply control device, the power supply control device further comprises overheat protector operating such that when the semiconductor switch is overheated, the overheat protector turns off the semiconductor switch, to thereby protect the semiconductor switch, when an imperfect short having some short resistance occurs, the semiconductor switch is repeatedly turned on and off by the controller, whereby the current is greatly varied. That is, in this case, the periodic heating of the semiconductor switch quickens the turning off of the semiconductor switch by the overheat protector. In particular, the power supply control device of the invention can process the abnormal current caused by the imperfect short (layer short), which cannot be processed by any way than the program processing by the MICROCOMPUTER or the like in the conventional device, by using only the hardware circuit contained in the power supply control device per se, or not using the control from an external device, such as MICROCOMPUTER. Therefore, the device circuit is simplified, and hence the device cost is reduced.

In the power supply control device, it is preferable that the semiconductor switch, the reference voltage generating device, the detector, the controller, and the second reference voltage generating device or the overheat protector are formed on one and the same chip. In the ninth power supply control device, the reference current generating device is preferably located outside the chip. By fabricating those means and switch into one chip in an integrating fashion, the device circuit construction is reduced in size, the packing space is reduced, and the device cost is reduced. In the invention, the current detection is based on the detection of a difference between the terminal-terminal voltage of the semiconductor switch and the reference voltage. With formation of the semiconductor switch and the second semiconductor switch on one and the same chip, the invention succeeds in eliminating (removing) common mode error factors which will appears in both the main semiconductor switch and the second semiconductor switch (reference voltage generator) to the almost same extend in the current detecting operation, i.e., adverse influences by power voltage drift and temperature drift, and uneven quality among lots. Additionally, with the feature that the reference current generating device is located outside the chip, the reference voltage (reference current) is made to be insensitive to temperature variation of the chip. Accordingly, high precision current detection is realized.

The power source terminal and the control signal input terminal of the semiconductor switch are connected to the power source terminal and the control signal input terminal of the second semiconductor switch of the reference voltage generating device, respectively. Further, the negative terminal of the second semiconductor switch is connected to the reference current generating device. With such an arrangement, judgement is made as to whether or not current flowing through the power supply path is within a normal range or an abnormal range by comparing a potential at the load terminal of the semiconductor switch with that at the negative terminal of the second semiconductor switch. Thus, the terminals of the semiconductor switch and the second semiconductor switch are commonized. Accordingly, those switches may easily be integrated onto one chip.

In the power supply control device, prohibiting device prohibits the controller from turning on and off the semiconductor switch for a fixed period after the semiconductor switch is turned on. Usually, when the load starts its operation, an inrush current usually flows into the power supply path. The inrush current is much greater than the current in a stationary state. If the controller executes the overcurrent control for the inrush current, some time is taken till the load is settled down into a stationary state. As a result, the response of the load per se delays sometimes. The invention solves this problem through the prohibiting control by the prohibiting device.

In the power supply control device, number-of-times controller adds up the number of times that the control means turns on and off the semiconductor switch, and when the number of on/off control times reaches a predetermined number of times, the number-of-times controller turns off the semiconductor switch. When an overcurrent by a short circuit is detected, the overheat protector quickly functions to make an overheat shut-off (turn off) of the semiconductor switch. In the case of the imperfect short, the semiconductor switch is repeatedly turned on and off. The resultant periodic heating of the semiconductor switch causes the overheat protector to function. Accordingly, it is estimated that time taken till the overheat shut-off is relatively long. In this connection, in the invention, when the number of on/off controls reaches a predetermined number of times, the semiconductor switch is turned off. Therefore, even when the imperfect short occurs, the turning-off of the semiconductor switch may be quickened to a desired turning-off time.

DETAILED DESCRIPTION OF PREFERRED EMBODIMENT

The preferred embodiments of the present invention will be described in the order of first embodiment, second embodiment and modification, while referring to FIGS. 1 through 7. In the embodiment descriptions to be given hereafter, a power supply control device and method is applied to a device which selectively supplies power source from a battery to loads, such as lamps, in a vehicle, and controls the supply of electric power to the loads. It should be understood that the invention may be applied to any form of the power supply control device and method if it controls the supply of electric power from a power supply to the load or loads in a switching manner.

Figure 1:
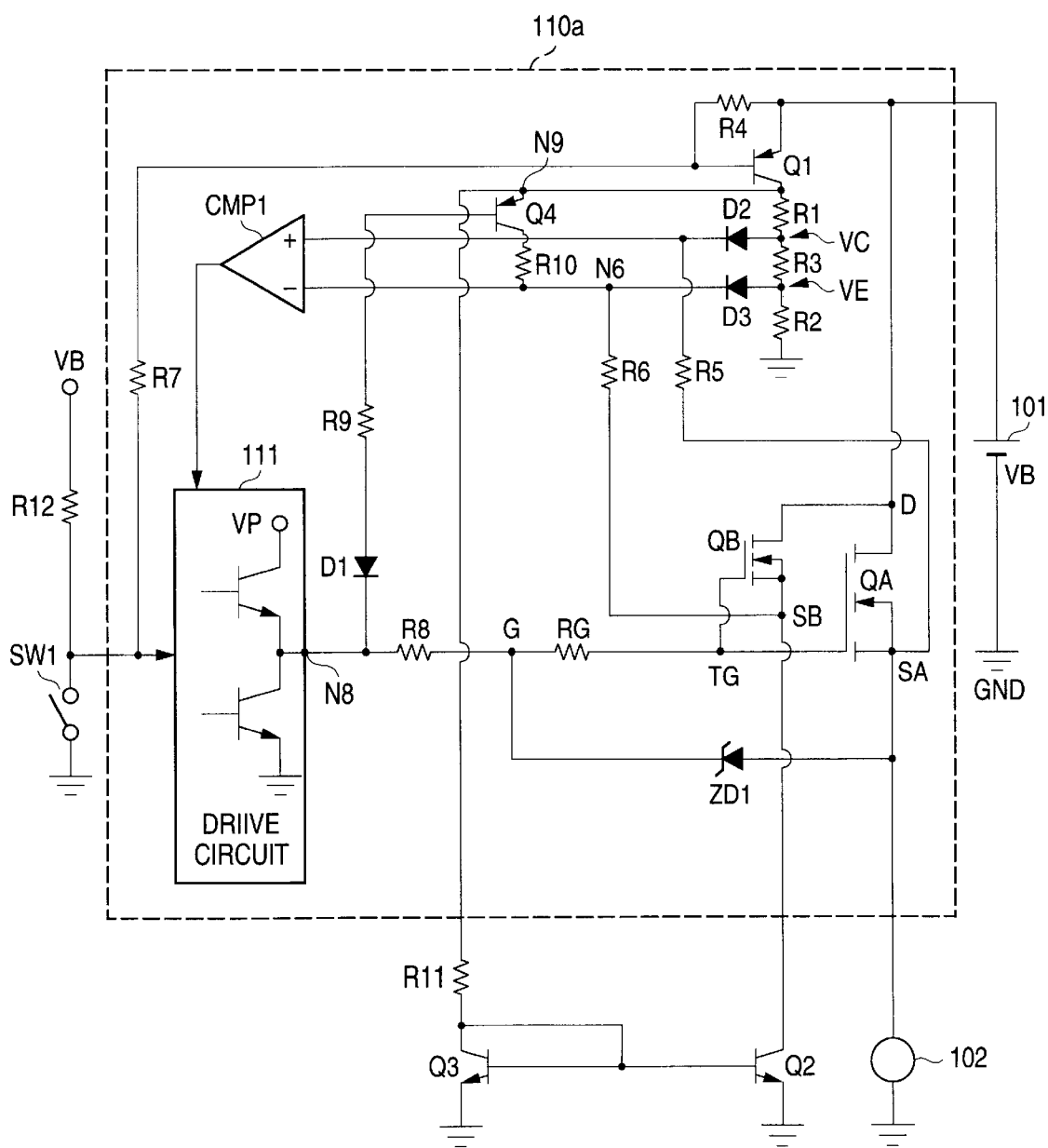
FIG. 1 is a circuit diagram showing a power supply control device which is a first embodiment of the present invention.
Figure 2:
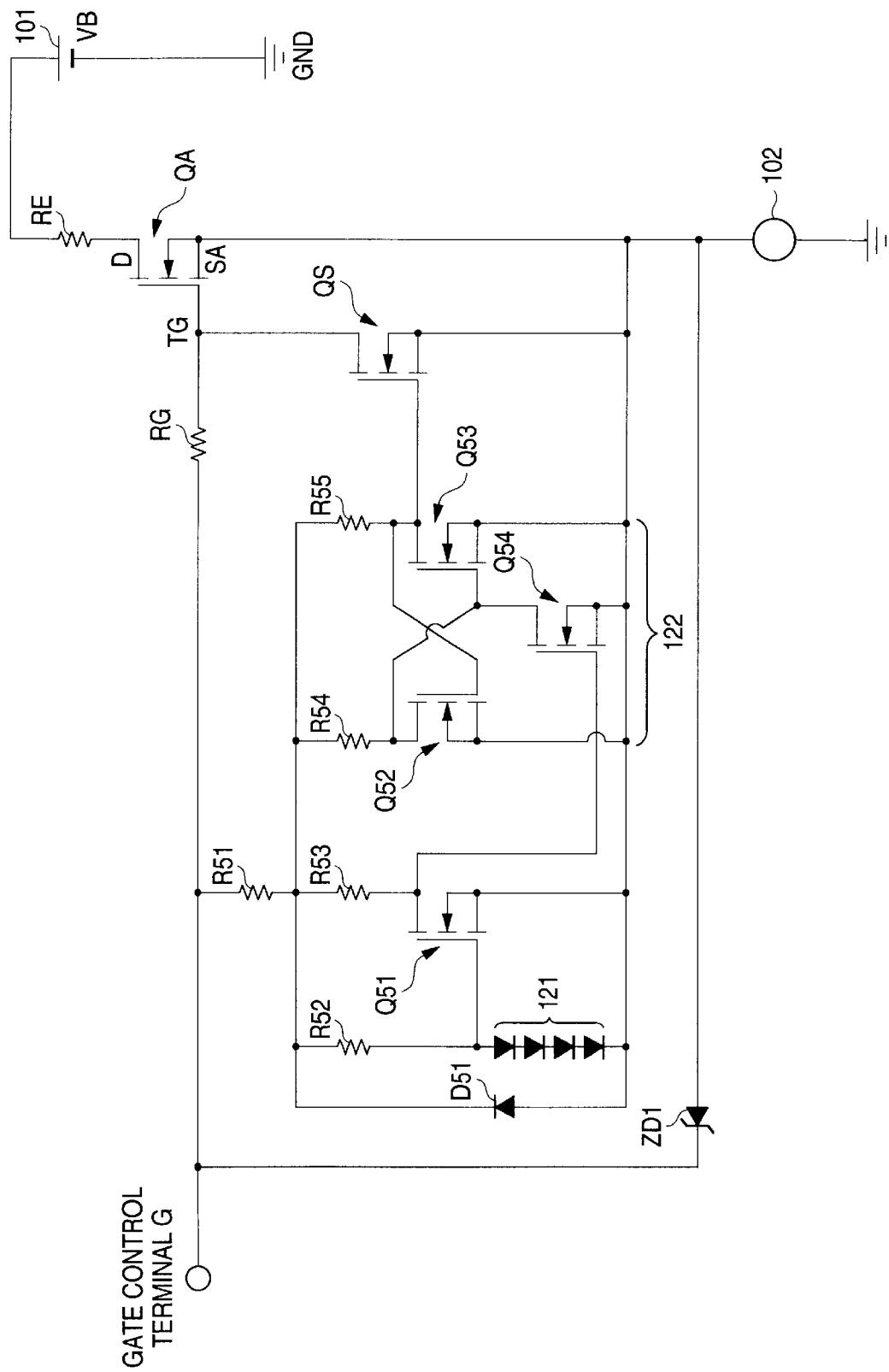
FIG. 2 is a circuit diagram showing the detail of a semiconductor switch (main control FET) used in the embodiment.
Figure 3:
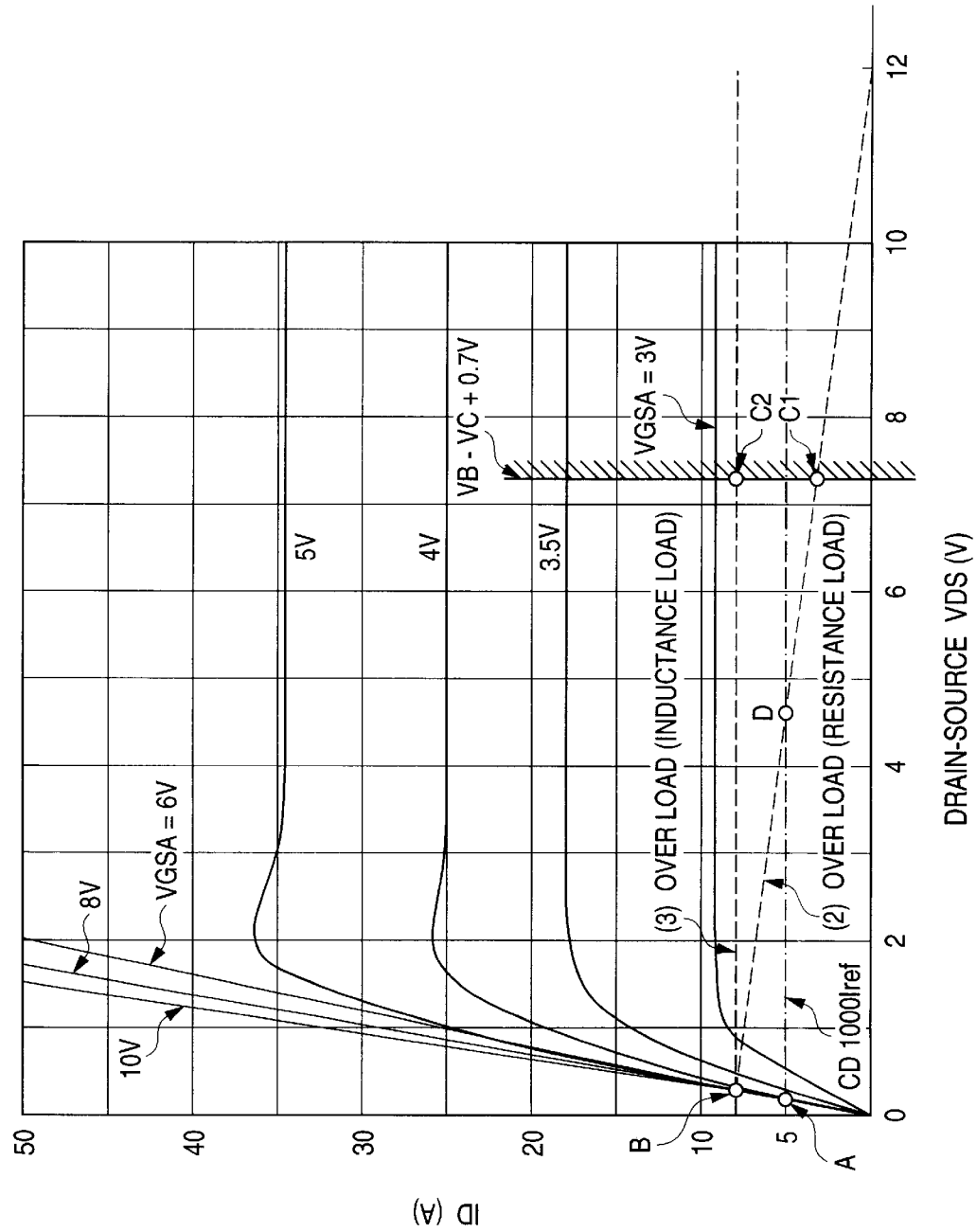
FIG. 3 is a graph showing operation characteristics of a main control FET and a reference FET in the power supply control device of the embodiment.
Figure 4:
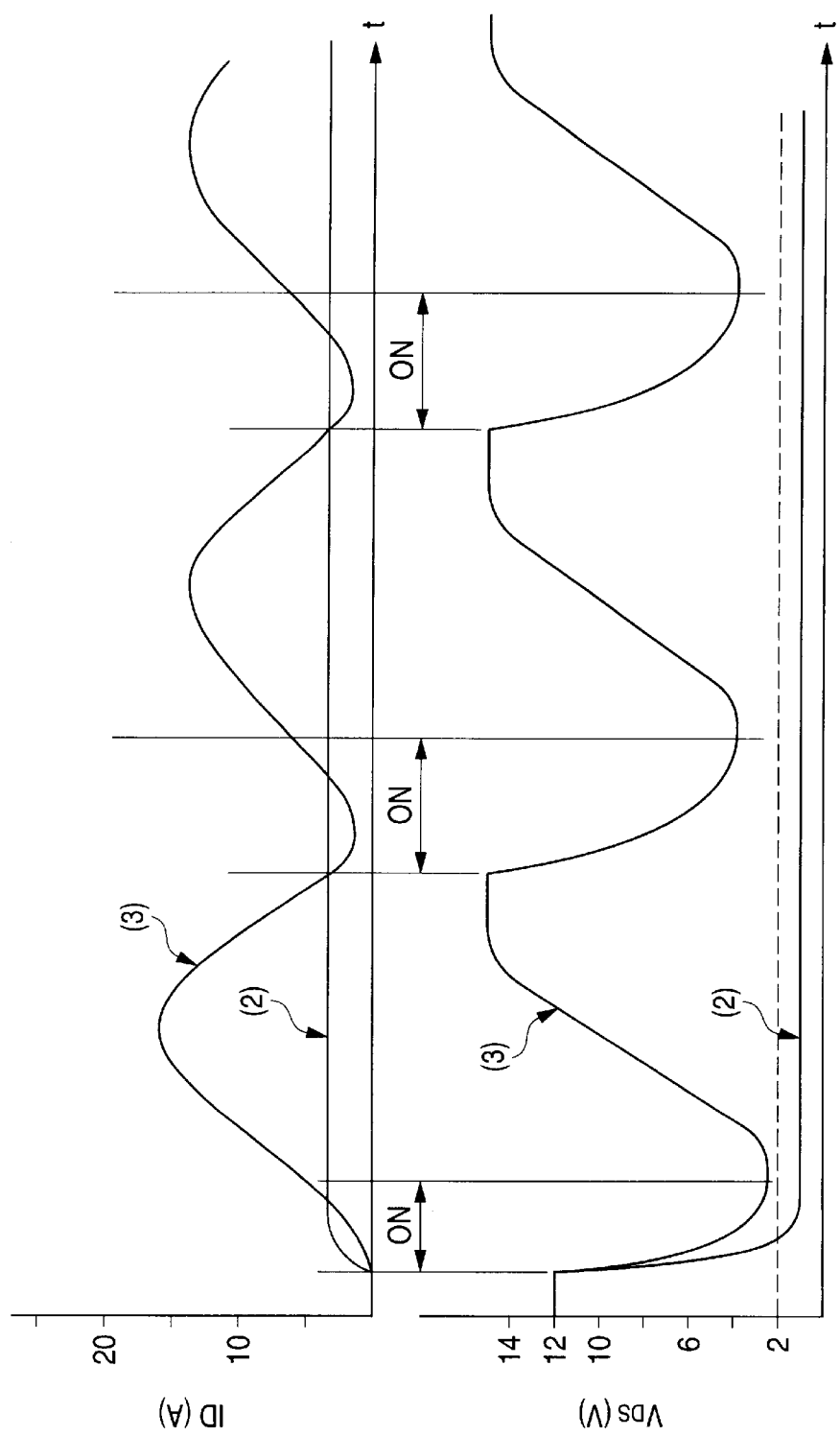
FIG. 4 is a waveform diagram showing variations of current and voltage in the semiconductor switch in the power supply control device when the device suffers from a short and it normally operates.
Figure 5:
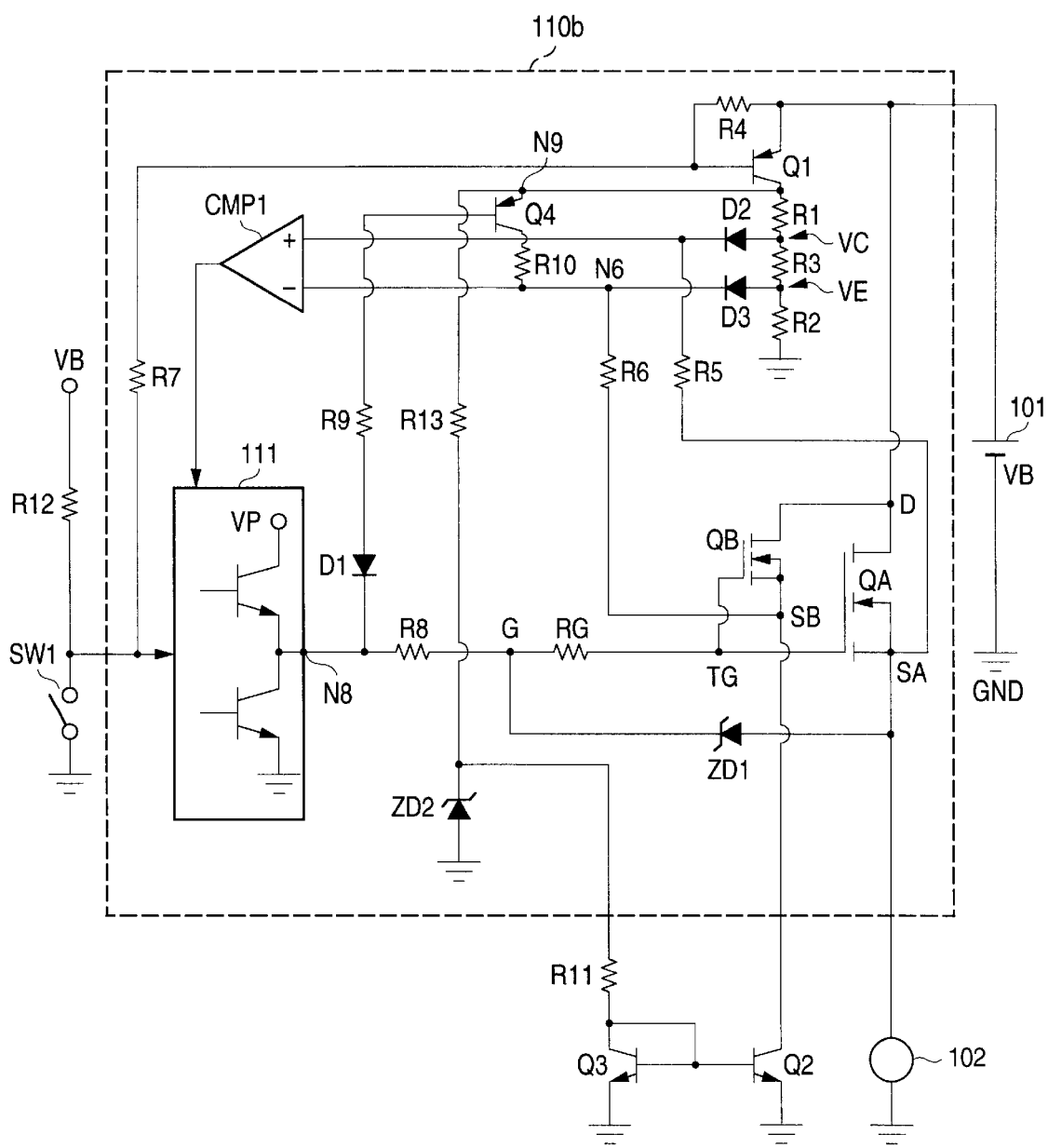
FIG. 5 is a circuit diagram showing a power supply control device which is a second embodiment of the invention.
Figure 6:
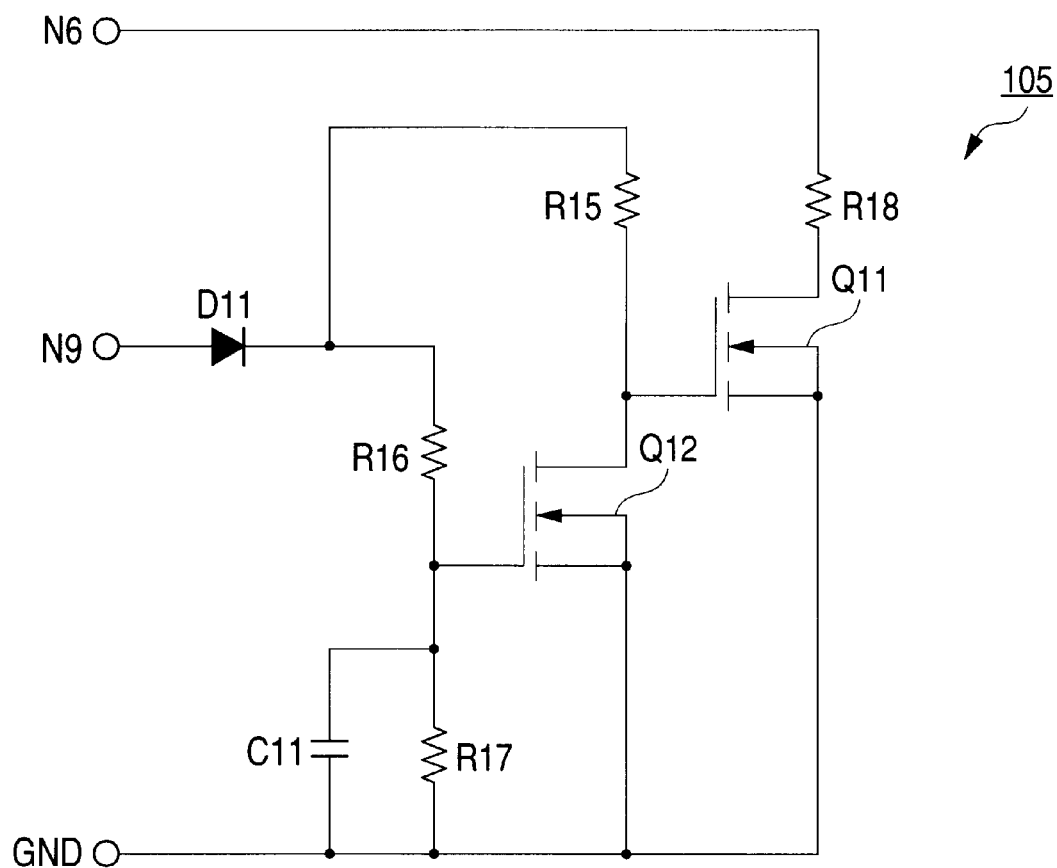
FIG. 6 is a circuit diagram showing a circuit additionally used in a modification of the power supply control device.
Figure 7:
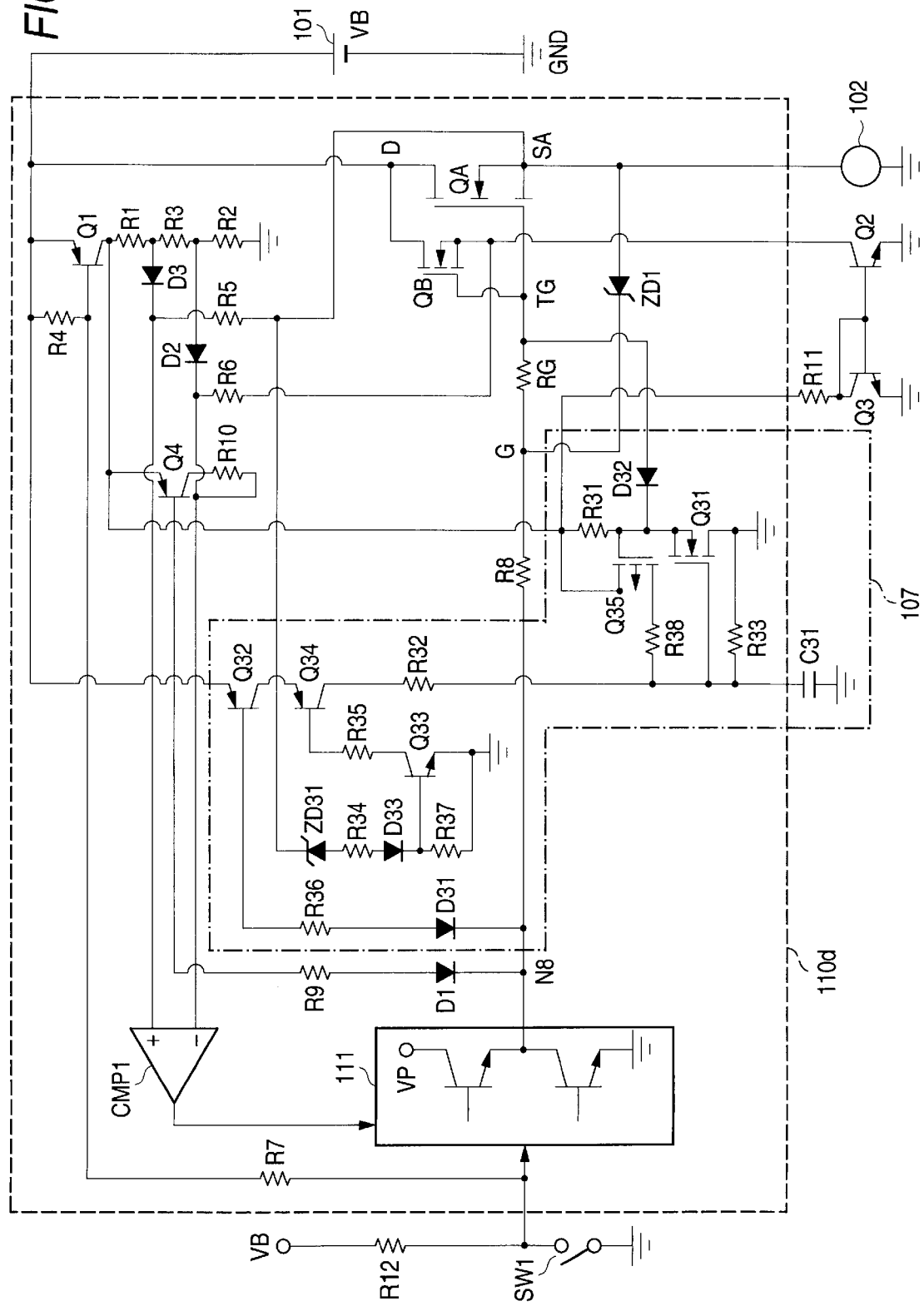
FIG. 7 is a circuit diagram showing a second modification of the power supply control device.
Figure 8:
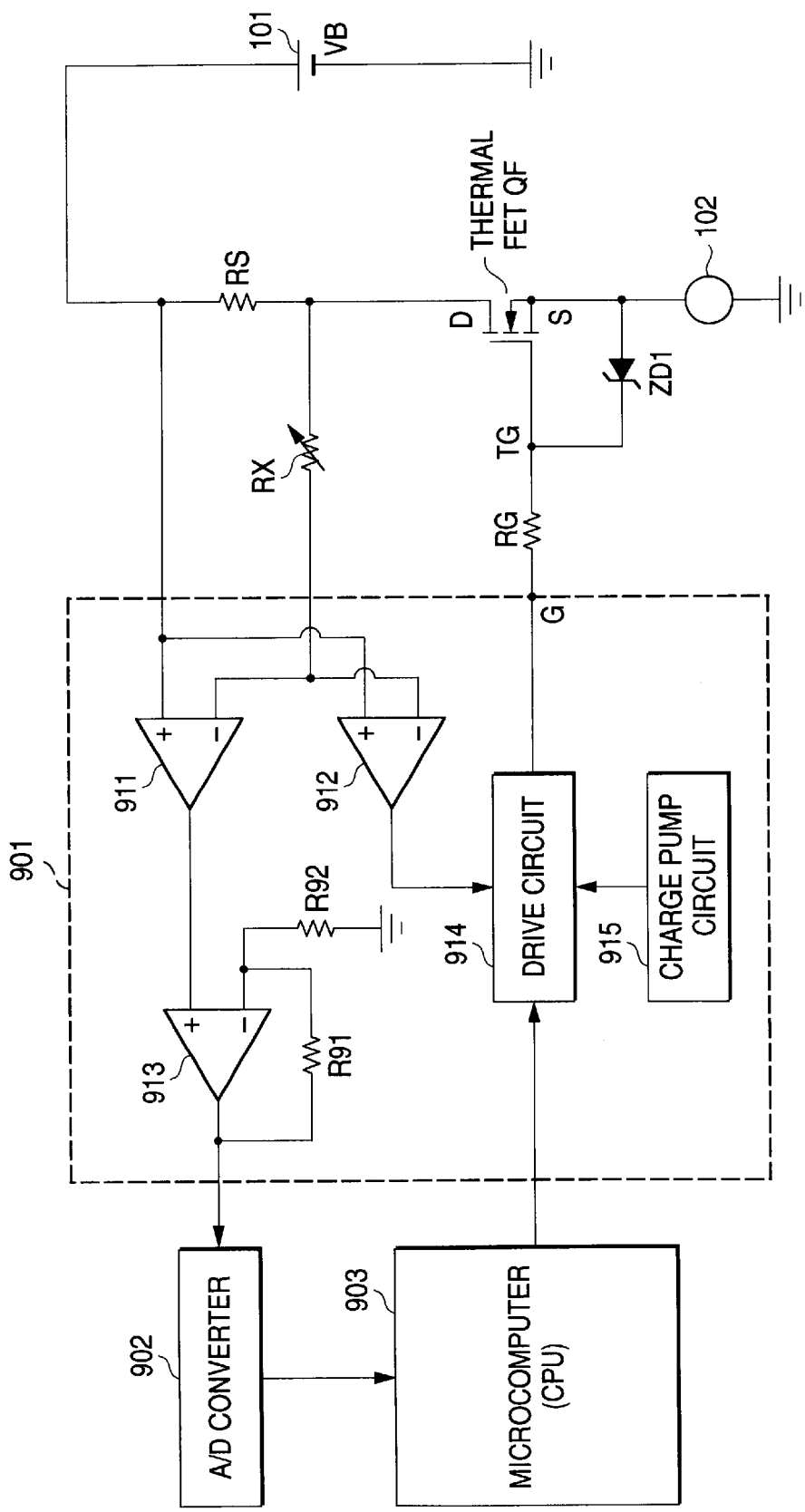
FIG. 8 is a circuit diagram showing a conventional power supply control device with a semiconductor switch.

FIG. 1 is a circuit diagram showing a power supply control device which is a first embodiment of the present invention. FIG. 2 is a circuit diagram showing the detail of a semiconductor switch (main control FET) used in the embodiment. FIG. 3 is a graph showing operation characteristics of a main control FET and a reference FET in the power supply control device of the embodiment. FIG. 4 is a waveform diagram showing variations of current and voltage in the semiconductor switch in the power supply control device when the device suffers from a short and it normally operates. FIG. 5 is a circuit diagram showing a power supply control device which is a second embodiment of the invention. FIG. 6 is a circuit diagram showing a circuit additionally used in a modification of the power supply control device. FIG. 7 is a circuit diagram showing a second modification of the power supply control device.

First Embodiment

A power supply control device, which forms a first embodiment of the present invention, will be described in accordance with FIG. 1. The power supply control device is arranged such that a drain (D)—source (SA) path of a main control FET QA as a semiconductor switch is inserted in a series fashion in a path for supplying an output voltage VB of a power supply 101 to a load 102. In this instance, the main control FET QA is an NMOS FET having a DMOS structure. If required, it may be a PMOS FET.

In the figure, a circuit section for driving and controlling the main control FET QA includes a reference FET (second semiconductor switch) QB, resistors R1 to R12, and RG, a Zener diode ZD1, diodes D1 to D3, transistors Q1 to Q4, a comparator CMP1, a drive circuit 111, and a switch SW1. In the specification description to follow and the accompanying drawings attached thereto, the resistors are denoted as R followed by reference numerals and characters. Those denotations specifically represent the resistors and resistance values of those resistors. A circuit section 110a enclosed with a dotted line indicates a circuit section to be analog integrated onto a chip (this section will be referred to a chip-circuitry section).

The load 102 includes for example, head lights, drive motors for power windows and others, and starts to operate upon turning-on of a related switch SW1 by a user. The drive circuit 111 contains transistors being connected in series; a source transistor whose collector is connected to potential VP and a sink transistor whose emitter is connected to ground potential (GND). In accordance with signals produced by turning on and off a switch SW1, the source and sink transistors in the drive circuit are turned on and off, so that a signal for driving and controlling the main FET QA is produced. In the figure, VB indicates an output voltage of the power supply 101, e.g., 12V, and VP stands for an output voltage of the charge pump circuit, e.g., VB+10V.

The detail of the main FET QA as the semiconductor switch is as shown in FIG. 2. In FIG. 2, the main FET QA includes an internal resistor RG, a temperature sensor 121, a latch circuit 122 and an overheat shut-off FET QS. ZD1 represents a Zener diode. The Zener diode keeps the voltage between the gate G and the source SA at 12V. If more than 12V voltage is applied between the gate G and source SA of FET, the Zener diode forms a bypass for a current caused by the overvoltage.

The main FET QA of the embodiment has the following over heat shut-off function. When a temperature sensor 121 detects that temperature of the main FET QA rises to be in excess of a predetermined temperature value, the detected information is held by a latch circuit 122, and an overheat shut-off FET QS is turned on so as to reduce a voltage between the gate TG and source SA to be zero volt. In turn, the main FET QA is forcibly turned off.

The temperature sensor 121 includes four diodes to be connected in cascade, and is formed at a location near the main FET QA by packaging requirements. With rising of temperature of the main FET QA, forward voltage drops of those diodes of the temperature sensor 121 decrease. When the gate potential of an FET Q51 decreases to a potential of an "L" level, a state of the FET Q51 shifts from and an on state to an off state. As a result, a gate potential of an FET Q54 is pulled up to a potential at the gate control terminal G of the main FET QA. The FET Q54 shifts its state from an off state to an on state, so that "1" is latched in the latch circuit 122. At this time, the output of the latch circuit 122 is put at "H" level, and the overheat shut-off FET QS shifts its state from an off state to an on state. IN turn, a potential at the true gate TG of the main FET QA becomes the same potential at the source SA so that FET QA turns off.

This embodiment of the power supply control device provides such protection from over current that if there happens to be a complete short circuit or a incomplete short circuit between the wiring from source SA of FET QA to the load 102, and the ground potential level, it prevents an over current from flowing through FET QA. This protection will be explained with reference to FIG. 1 as follows.

Reference current generating device, which will be found in the claim description, is formed with a resistor R11 and NPN transistors Q2 and Q3. As shown, the bases of the transistors Q2 and Q3 are interconnected, and the emitters of those transistors are connected to ground potential. The collector of the transistor Q3 is connected to one end of the resistor R11 and the bases of the transistors Q2 and Q3. The other end of the resistor R11 is connected to the collector of a transistor Q1, which is used for dark-current measure as will be described later. The collector of the other transistor Q2 is connected to the source SB of the reference FET QB.

In the circuitry thus arranged, the collector current IC(Q3) of the transistor Q3 is expressed by $$IC(Q3)=\{VB-(\text{on-voltage of } Q1)-(\text{on-voltage of } Q3)\}/R11.$$

The (on-voltage of Q1) and (on-voltage of Q3) are smaller than the power voltage VB. Accordingly, those voltages may be neglected, and then IC(Q3)≈VB/R11. From this, it is seen that the collector current IC(Q3) is proportional to the power voltage VB, and depends on the same.

The reference current generating device includes a current mirror circuit. Accordingly, the collector current IC(Q2) of the transistor Q2 is equal to the collector current IC(Q3) of the transistor Q3; IC(Q2)=IC(Q3). The reference current Iref flowing through the reference FET QB equals to IC (Q2), therefore, it depends on the power voltage VB. In the case of FIG. 1, the two transistors Q2 and Q3 are provided outside the chip-circuitry section or chip 110a. To satisfy IC(Q2)=IC(Q3), those transistors Q2 and Q3 must be equal in dimension. It is preferable that the transistors Q2 and Q3 are formed within the chip 110a rather than outside the chip 110a so that formation of the transistors having the same dimensions is easy, and the integration in fabricating the power supply control device is more enhanced.

The reference voltage generating device includes the reference FET QB. The voltage between the drain and source of the reference FET QB is the reference voltage to be generated. The drain and gate of the reference FET QB are connected to the drain D and true gate TG of the main control FET QA. The source SB of the reference FET QB is connected to the collector of the transistor Q2. In this circuit, the reference FET QB and the main control FET QA are common in the drain D and the gate TG have the common potentials in their drains and gates respectively. This feature makes it easy to integrate them onto one chip (110a).

The reference FET QB and the main control FET QA are formed on one and the same chip (110a) by one fabricating process. The current detecting method in the embodiment is based on the difference between the voltage VDSA between the drain and source of the main control FET QA and the reference voltage VDSB between those of the reference FET QB, which is detected by the comparator CMP1. Thus, the reference FET QB and the main control FET QA are fabricated onto one chip. Accordingly, the invention succeeds in eliminating (removing) common mode error factors witch sill appears in both the main semiconductor switch and the second semiconductor switch (reference voltage generator) to the almost in the current detecting operation, i.e., adverse influences by power voltage drift and temperature drift, and uneven quality among lots. Further, the resistor included in the current mirror circuit (resistor R11) as the reference current generating device is located outside the chip 110a. With this feature, the reference voltage is made to be insensitive to temperature variation of the chip 110a. Accordingly, high precision current detection is realized.

In order that a current capacity of the reference FET QB is smaller than that of the main control FET QA, a ratio of the number of the parallel connected transistors forming the reference FET QB and the number of the parallel connected transistors forming the main FET QA is selected typically as (number of the transistors of *FET QB*: 1)<(number of the transistors of *FET QA*: 1000)

A resistance value of the resistor R11 is selected so as to satisfy $IC(Q3)=IC(Q2)=Iref=IDQALimX$(number of the transistors of *FET QB* : 1) /(number of the transistors of *FET QA*: 1000)= $IDQALim/1000$.

In the above relations, IDQALim is reference current value used for judging whether or not the current of the load 102 is an over current. Assuming that load resistance when a current of the reference current value IDQALim flows, as a load current, through the main FET QA is Rlim, the following relation holds $IDQALim=\{(VB-(on\text{-voltage of } QA)\}/RLim \approx VB/Rlim$ Since $IC(Q3) \approx VB/R11$, then $VB/R11=VB/(Rlim \times 1000)$, and $R11=RLim \times 1000$. Here, Rlim is a load resistance value used for judging whether or not the load is an over load, or abnormal. Therefore, the resistance R11 is a fixed resistance value determined corresponding to the reference resistance value Rlim.

As described above, since the current of the reference current value Iref, which flows through the reference FET QB is VB/R11, the reference current value Iref depends on (proportional to) the power voltage VB. Accordingly, the reference current value IDQALim is proportional to the power voltage VB. However, the reference resistance value Rlim is fixed, independent of the power voltage VB.

This will be described using numerical values. In an example where when R11=2.4 kΩ, the load resistance is 2.4 Ω (2.4 kΩ/1000=2.4 Ω), the drain-source voltage of the main FET QA is equal to that of the reference FET QB; VDSA=VDSB. When the load resistance decreases to below 2.4 Ω, VDSA>VDSB. This state is judged to be an overload state. This will be described by using the load current. When VB (power voltage)=12V, current of 5 mA (collector current IC(Q3) of the transistor Q3) flows through the resistor R11. When the load current is 5A (5 mA×1000=5A), the drain-source voltage of the main control FET QA is equal to that of the reference FET QB; VDSA=VDSB. When the load current of 5A or larger flows, it is judged that it is an overcurrent (overload). When the power voltage VB is 16V, the reference resistance value for overload judgement is invariable at 2.4 Ω, the reference current value for overload judgement is 6.67A (16V/2.4 Ω=6.67A), and its value is changed (increased) to be higher than 5A when VB=12V.

So long as the load and the wiring are normal, the total resistance of the load (=load resistance+wiring resistance) remains unchanged. For this reason, to judge whether or not a state of the load including the wiring is normal, it is desirable that the reference resistance value for the overload judgement is set at a fixed value. This condition is satisfied by the method employed in the embodiment, viz. the reference current value Iref depends on the power voltage VB, since in the method, the reference resistance value for the overload judgement is set at a fixed value. However, a constant current method (second embodiment) to be described later in which the reference current value Iref is fixed independently of the power voltage, is more preferable for a case where it is required to judge as to whether or not the value of the current flowing through the load exceeds a reference current value, while being independent of the power voltage VB.

Where the circuit specifications mentioned above are employed, the Reference current generating device and the reference voltage generating device (reference FET QB) may be minimized in circuit scale. The result is minimization of the packaging space and reduction of the device cost.

The comparator CMP1 forms a part of "detector" used in the claim descriptions. The source voltage VSA of the main control FET QA is applied through the resistor R5 to the "+" input terminal of the comparator CMP1. A source voltage VSB of the reference FET QB is applied through the resistor R6 to the "−" input terminal of the comparator CMP1. When a potential applied to the "+" input terminal of the comparator CMP1 is higher than that applied to the "−" input terminal, its output is valid ("H" level). When a potential applied to the "+" input terminal of the comparator is lower than that at the "−" input terminal, the comparator output is invalid ("L").

The reference voltage of the reference voltage generating device, viz., a threshold value at which the output level of the comparator CMP1 shifts from an "H" level to an "L" level, may be changed to another value by adjusting the reference current value Iref of the Reference current generating device. Some possible ways of changing the setting of the reference current value Iref of the Reference current generating device (i.e., the reference of the reference voltage generating device) are:

a) To locate the two transistors Q2 and Q3 outside the chip, and to select their configurations and dimensions according to required specifications.

b) To locate the resistor R11 outside the chip, and to select its configuration and dimension according to required specifications.

c) To use the combination of a) and b) above.

d) To change a resistance value of the resistor R11 within the chip.

A value of the reference current (reference voltage) may be set at a target value in a manner that a plurality of resistors are disposed in parallel in the chip, and a desired resistor is selected from among those plural resistors by means of switching means when the chip is packaged or the bare chip is mounted. By so doing, even when the power supply control device is fabricated in an integrated fashion, a plurality of specifications can be covered with one type of chip. With the variable setting of the reference current (reference voltage), it is possible to reliably detect the discrimination of the perfect short from the imperfect short for each type of the load (head lamps, drive motors or the like). Device protection against the short trouble is accurately performed.

The PNP transistor Q1 inserted between the power supply 101 and the resistor R1 is provided for dealing with a dark current. Where the transistor Q1 is not used, even when the power supply to the load 102 is not instructed, viz., the drive control of the main control FET QA is not carried out, a path of the dark current ranging from the power supply 101 to GND (ground potential) exists. Accordingly, the electric power of the power supply 101 is consumed, although its amount is small, even when the switch SW1 is in an off state. For reducing the electricity consumption of power supply 101 by the dark current, the transistor Q1 is turned on when the switch SW1 is turned on (instruct to supply the power to the load 102), and the transistor Q1 is turned off when the switch Sw1 is turned off. Therefore, the path for dark current is cut off.

The resistors R1 to R3, and the diodes D2 and D3 form a diode clamping circuit. When the transistor Q1 is in an on state, VC>VE holds where VC is a potential at a node between the resistors R1 and R3, and VE is a potential at a node between the resistors R3 and R2.

When VSA (source voltage of FET QA)≧VC−0.7V (=forward voltage drop of the diode), the source voltage VSA is applied to the "+" input terminal of the comparator CMP1. When VSA<VC−0.7V, a potential of (VC−0.7V) is applied to the "+" input terminal of the comparator CMP1, independently of the source voltage VSA. Thus, even if the source voltage VSA drops, the "+" input terminal of the comparator CMP1 is held at VC−0.7V and does not drop below this potential. The "−" input terminal of the comparator CMP1 is held at a potential of VE−0.7V even if the source voltage VSB of the reference FET QB drops to a value lower than the potential (VE−0.7V).

With provision of the diode clamping circuit, even when the main control FET QA and the reference FET QB shift their state to an off state and the source voltage VSA and the source voltage VSB drop, the "+" input terminal and "−" input terminal of the comparator CMP1 are clamped at (VC−0.7V) and (VE−0.7V), respectively. Since VC>VE, the output of the comparator CMP1 is set at "H" level. And the main control FET QA is reliably controlled irrespective of the amplitudes of the source voltage VSA and the source voltage VSB. It never happens that the potential at the "+" input terminal and the "−" input terminal of the comparator CMP1 drops to a reference potential value. In this respect, the voltage withstand capability of the "+" input terminal and "−" input terminal is improved.

An operation of the power supply control device of the embodiment, viz., a power supply control method, will be described with reference to FIG. 3. In gathering data plotted in a graph of FIG. 3, the main control FET QA is a thermal FET, "HAF2001", manufactured by Hitachi Corporation in Japan. Operation characteristics of the main control FET QA and the reference FET QB are plotted where the power voltage VB=12V. In FIG. 3, the abscissa represents the drain-source VDS (VDSA or VDSB), and the ordinate represents the drain current ID (IDQA or 1000×IDQB).

In FIG. 3, a one-dot chain line indicates a reference value for the overload (overcurrent) when Iref (reference current)=5 mA. Since 1000×Iref=5A, it is depicted in (1) as a horizontal line of 5A. This represents an operating line of the reference FET QB when it is converted into that of the main control FET QA. When the load and wiring are normal and the main control FET QA and the reference FET QB are in an on state, an operating point of the reference FET QB is a point A in the figure. The operating point of the main control FET QA is present between the origin and the point A. It is assumed that the load is in an overload state and an overcurrent, for instance, the drain current IDQA=8A, flows. An operating point of the main control FET QA at that moment is a point B. At this time, IDQA (drain current of FET QA)>1000×Iref. Accordingly, the output of the comparator CMP1 is at an "L" level, and the main control FET QA and the reference FET QB shift their state to an off state.

In FIG. 3, a dotted line (2) indicates a load line depicted when the load is a resistive load and in an overload state, and further it contains the operating point B. Here, the resistive load is such a load that the inductance component of the load and wiring is much smaller than the resistive component. A specific example of it is a lamp load. When the load is the resistive load, the operating point of the main control FET QA moves from the point B to the right side along the straight load line (2), with increase of the drain-source voltage VDSA. If the load line (2) intersects the reference value line (1) for overload judgment at a point D, a relation IDQA>1000×Iref holds when the drain-source voltage VDSA lies in a region on the left side of the point D. When the operating point of the main control FET QA lies in a region on the right side of the point D, a relation IDQA<1000×Iref holds. The main control FET QA shifts its state to an on state.

Measures for preventing the main control FET from turning on as soon as the operating point enters the region on the right side of the point D are taken by the embodiment. The measure utilizes such a phenomenon that when the gate drive of the main control FET QA by the drive circuit 111 is turned off, a potential at the output node of the drive circuit 111 becomes ground potential by the sink transistor within the drive circuit 111. By the utilization of the phenomenon, current is made to flow through a path of base of the transistor Q4→resistor R9→diode D1→node N8→GND (ground potential), whereby the transistor Q4 is turned on. By so doing, the "−" input terminal of the comparator CMP1 is kept at high potential, and even if the operating point of the main control FET QA is on the right side of the point D, it maintains its off state. In a case where the potential at the "−" input terminal of the comparator CMP1 is excessively pulled up to the high potential, when the source voltage VSA and the source voltage VSB drop, a timing where a logic level at the output of the comparator CMP1 is inverted from an "L" level to an "H" level by the diode clamping circuit, delays. To prevent this, it is desirable to select a resistance value of the resistor R10, which is connected between the collector of the transistor Q4 and the "−" input terminal of the comparator CMP1, so as to satisfy R10: R6 R1: R3.

In the diode clamping circuit, voltage VC obtained by dividing the power voltage VB by a series circuit of the resistors R1, R2 and R3 is $$VC=VB\cdot(R2+R3)/(R1+R2+R3)$$

When the forward voltage drop of the diode D2 is 0.7V, the drain-source voltage VDSA of the main control FET QA whereupon the potential at "+" input terminal being to be clamped by the potential of VC−0.7V is $$VDSA = (VB - VC + 0.7)$$

In FIG. 3, this is depicted as a hatched vertical line located near VDSA=7.3V.

An intersection of the load line (2) and the vertical line is denoted as C1. When the operating point moves to and enters a region on the right side of the point C1, the gate drive of the main control FET QA by the drive circuit 111 is turned on. After a time of the circuit operation delay elapses, a potential at the output node N8 of the drive circuit 111 changes from the "L" level to the "H" level. And the main control FET QA is turned on again. During the operation delay time of the drive circuit 111, the operating point further moves to the right side. When the main control FET QA is turned on, the operating point turns its moving direction to the left, and starts to move.

When the potential at the output node N8 of the drive circuit 111 goes high in logical level, the transistor Q4 shifts its state to an off state. As a result, the pulling up action of the potential at the "−" input terminal of the comparator CMP1 by the transistor Q4 disappears. Accordingly, when the operating point of the main control FET QA enters a region on the left side of the point D, the drive circuit 111 is put in an off control mode, and after the circuit operation delay time, the main control FET QA is turned off. During the operation delay time of the drive circuit 111, the point D shifts to the left beyond the point D, and then changes its moving direction and starts to move to the right. By repeating the above process, the main control FET QA and the reference FET QB are repeatedly turned on and off.

In FIG. 3, a line (3) represents a load line when the load is an inductive overload. Here, the inductive load means such a load that an inductance component of the load and wiring is much larger than a resistance component, and an example of it is a motor load. When the load is an inductive load, the operating line of the main control FET QA is a horizontal straight line containing the point B as shown in the line (3). When the main control FET QA shifts its state to an off state, the operating point of the main control FET QA moves from the point B to the right along the load line (3).

In the case of the inductive load, if the main control FET QA and the reference FET QB turn off, both the main current IDQA and the reference current Iref are unchanged until VDSA reaches to the point C2 shown in FIG. 3. The point C2 denotes intersection of the operating line (3) and the vertical line at VB−VC +0.7V. In other words IDQA is always larger than one thousand times Iref on the left side of the point C2 irrespective of pulling up the "−" input terminal by the FET Q4 unlike the resistive load. When the operating point of FET QA enters the region on the right side of the point C2, the output of CMP1 turns from "L" level to "H" level. Since there is a delay time in the drive circuit 111, operating point of FET QA goes on to the right side beyond the point C2 during the delay time. When FET QA and QB begin to turn on, the operating point changes the moving direction and starts to move to the left.

When the drain-source voltage VDS decreases and the operating point of the main control FET QA reaches the point C2, the drive circuit 111 is put in an off control mode. After the operation delay time of the circuit, the main control FET QA shifts its state to an off state. During the operation delay time of the drive circuit 111, the operating points further moves to the left beyond the point C2. When the potential at the output node N8 of the drive circuit 111 changes from an "L" level to an "H" level, the operating point changes its moving direction and starts to move to the right, however. Repeating the above process, the main control FET QA and the reference FET QB are repeatedly turned on and off.

IDQB=IC(Q2), and when n×IDQB>IDQA, the main control FET QA and the reference FET QB are keep to be in an on state. When n×IDQB<IDQA, the main control FET QA and the reference FET QB are turned on and off. Here, "n" is a ratio of the number of transistors of the main control FET QA to that of the reference FET QB, and IDQA and IDQB are the drain currents of the main control FET QA and the reference FET QB. That is, when the load current IDQA of the main control FET QA increases to be larger than a current which is n times as large as the reference current value Iref (IC(Q2)), those FETs are repeatedly turned on and off. After a predetermined time elapses, the main control FET QA and the reference FET QB are turned off.

FIGS. 4(a) and 4(b) are waveform diagrams showing variations of current and voltage of the main control FET QA in the power supply control device of the embodiment. FIG. 4(a) shows a waveform of a drain current ID of the FET, and FIG. 4(b) is a waveform of the drain-source VDS. A waveform (2) represents a variation of the drain current ID in a normal state. A waveform (3) indicates a variation of it in an overload state (including a short of a wiring between the source and the load). In the overload state ((3) in the figure), the main control FET QA is repeatedly turned on and off, and a periodic heating of the main control FET QA causes the overheat shut-off protecting function to operate.

As described above, the power supply control device and method of the invention succeeds in eliminating the shunt resistor, conventionally used, connected in series to the power supply path in order to detect the current, and can detect an overcurrent with high precision without the shut resistor, and represses the heat loss of the whole device. Further, the power supply control device and method continuously detects, by the hardware circuit, an abnormal current flowing when a layer short, e.g., an imperfect short having some resistance, occurs, and as well an overcurrent caused when a perfect short occurs.

The on/off control of the semiconductor switch can be performed by only the hardware circuit which does not contain the MICROCOMPUTER. Accordingly, the power supply control device is reduced in packing space and device cost.

By the adjustment of the reference current value Iref of the Reference current generating device, it is possible to reliably detect the discrimination of the perfect short from the imperfect short for each type of the load (head lamps, drive motors or the like). Device protection against the short trouble is accurately performed.

Second Embodiment

A power supply control device and method, which forms a second embodiment of the present invention, will be described with reference to FIG. 5. The power supply control device of the embodiment is characteristically featured in that the Reference current generating device is constructed as a constant current source. Specifically, difference of the circuit arrangement (FIG. 1) of the power supply control device of the first embodiment is that a resistor R13 is inserted between the resistor R11 and the collector of the transistor Q1 in the Reference current generating device, and a Zener diode ZD2 is connected between the other end of the resistor R13 and ground potential. In FIG. 5, a circuit section 110b enclosed with a dotted line indicates a circuit section to be analog integrated onto a chip (this section will be referred to a chip-circuitry section).

In the circuit arrangement, the collector current IC (Q3) is given by $$IC(Q3) = \{VZD2 - (\text{on-voltage of } Q3)\}/R11$$

where VZD2 is a Zener voltage of the Zener diode ZD2. Accordingly, the collector current IC(Q3), or the reference current value Iref, is a constant current, which is not dependent on the power voltage VB.

The functions and modifications of the other elements, and operations of the power supply control device and method are substantially the same as of the first embodiment, and are valid in the power supply control device and method of the embodiment.

Modifications

Modifications of the power supply control devices of the first and second embodiments described above will be described in the order of first modification and second modification, with reference to the accompanying drawings.

First Modification

The first modification is characteristically featured in that a inrush current mask circuit 105 as shown in FIG. 6 is additionally used to the circuit arrangement (FIG. 1 or 5) of the power supply control device of the first or second embodiment.

When the load 102 (e.g., head lights) is turned on, inrush current flows, which is several to several tens times as large as a normal current in amplitude. The period that the inrush current flows depends on the type and capacity of the load 102, but is about 3 msec to 20 msec. If the overcurrent control as described in the first or second embodiment is carried out during the surge-current flowing period, some time is taken till the load is settled down into a stationary state. As a result, the response of the load per se delays sometimes. Specifically, the headlights are delayed in lighting. The embodiment solves this problem by adding the inrush current mask circuit 105 (corresponding to prohibiting device used in claims) to the circuit arrangement of FIG. 1 or FIG. 5.

In FIG. 6, the inrush current mask circuit 105 is made up of FETs Q11 and Q12, a diode D11, resistors R15 to R18, and a capacitor C11. Terminals N6 and N9 are connected to the nodes N6 and N9 in the FIG. 1 and the FIG. 5 circuit, respectively. A terminal GND is earthen.

The operation of the inrush current mask circuit 105 will be described. When the switch SW1 is turned on, the transistor Q1 is turned on. The power voltage VB is applied to the gate of the FET Q12 through the diode D11 and the resistor R16. The power voltage VB is applied to the gate of the FET Q11 through the diode D11 and the resistor R15.

The gate of the FET Q12 is connected to ground potential through the capacitor C11. The capacitor C11 is not yet charged immediately after the switch SW1 is turned on. In this state, the gate potential of the FET Q12 is insufficiently high, and the FET Q12 cannot shift its state to an on state. The FET Q11 is in an on state during the off state of the FET Q12, and pulls the potential at the "−" input terminal of the comparator CMP1 to a lower potential. For this reason, even if large inrush current flows, the output potential of the comparator CMP1 does not go low in logic level. And the main control FET QA does not shift its state to an off state.

With time, the capacitor C11 is gradually charged through the resistor R16, and in due time the FET Q12 shifts its state to an on state. With this, the FET Q11 shifts its state to an off state, the masking state terminates, and finally the overcurrent detection control functions.

The resistor R17 is a discharge resistor for resetting the capacitor C11 after the switch SW1 is turned off. Its resistance is preferably selected so as to satisfy R16<<R17 in order to eliminate adversely affect the masking time. The masking time is determined by a time constant of R16×C11. Where the circuitry is integrated into one chip in fabrication, the masking time can be adjusted by appropriately adjusting the capacitance of the capacitor C1 attached to the chip.

Second Modification

A power supply control device of the second modification will be described with reference to FIG. 7. The power supply control device of the modification is characteristically featured in that an on/off counter circuit 107 is added to the circuit arrangement (FIG. 1 or FIG. 5) of the power supply control device of the first or second embodiment. In FIG. 7, a circuit section 110d enclosed with a dotted line indicates a circuit section to be analog integrated onto a chip (this section will be referred to a chip-circuitry section).

In the first or second embodiment, when an imperfect short occurs, the main control FET QA is repeatedly turned on and off, and the resultant periodic heating of the main control FET QA causes the overheat shut-off function to operate. Accordingly, the time taken till the overheat shutting off is relatively long. This problem is solved in the following way by the modification. Specifically, the modification additionally uses the on/off counter circuit (number-of-times controller) 107 to quicken the turning off of the main control FET QA. The on/off counter circuit 107 turns off the main control FET QA when the number of on/off times reaches a predetermined time.

In FIG. 7, the on/off counter circuit 107 includes transistors Q32 to Q34, FETs Q31 and Q35, diodes D31 to D33, a Zener diode ZD31, resistors R31 to R38, and a capacitor C31. The conductivity type of the FET Q31 is opposite to that of the FET Q35. In FIG. 7, the FET Q31 is of the NMOS type, while the FET Q35 is of the PMOS type, and those FETs are arranged in a latch circuit.

The operation of the on/off counter circuit 107 will be described. Every time that the overcurrent control mode is set up, and the main control FET QA is turned off (the gate potential is set at an "L" level) during the on/off control of the FET QA, the capacitor C31 is charged through the transistors Q32 and Q34 and the resistor R32. The capacitor C31 is charged only when the drain-source voltage VDSA goes high in logic level during the off control (the gate potential is at the "L" level), and is not charged when FET QA keeps to be in the on state or in the off state continuously. The gate potential of the FET Q31 is lower than a threshold value in the initial stage, and is in an off state. With progress of the charging of the capacitor C31, the gate potential increases and the FET Q31 is turned on. At this time, the true gate of the main control FET QA is connected to ground potential through the diode D32, to turn off (off control) the main control FET QA. At this time, the FET Q35 is also turned on. Accordingly, the latch circuit including the FETs Q31 and Q35 holds information to the effect that the on/off counter circuit 107 turned off the main control FET QA.

In the power supply control device (FIG. 7) of the second modification, the drain of the FET Q31 is connected to the true gate (TG) of the main control FET QA by way of the diode D32, whereby the main control FET QA is directly on/off controlled. The modification may be further modified in the following way. In a first case, a prohibiting gate (2-input AND gate) is provided at the output of the comparator CMP1. A drain potential of the FET Q31 is used for its prohibiting control signal (the drain potential of the FET Q31 is input to the other input of the two-input AND gate). In a second case, the drain of the FET Q31 is connected through a resistor to the "+" input terminal of the comparator CMP1. Also in those first and second cases, it is necessary to form a latch circuit for holding information that the on/off counter circuit 107 has turned off the main control FET QA.

In a third case, after the on/off controls are added up, the main control FET QA is turned off (off controlled) by the overheat shut-off function, viz., by using a temperature sensor 121, a latch circuit 122 and an overheat shutting off FET QS (see FIG. 2). Specifically, the FET Q35 and the resistor R38 are removed, the resistor R31 is connected to the output node N8 in place of the collector of the transistor Q1, and the anode of the diode D32 is connected to the anode of the temperature sensor 121 (consisting of four diodes). In this case, when the FET Q31 is turned on, potential at the anode of the temperature sensor 121 (consisting of four diodes) is pulled down to a low potential. Accordingly, the same conditions as in high temperature state are set up, and the FET QS is turned on to turn off (off control) the main control FET QA.

Further, in the power supply control device of this modification, the number of on/off control times is judged based on a quantity of charge stored in the capacitor C31 in the on/off counter circuit 107. Alternatively, the on/off counter circuit 107 maybe formed with a counter for directly counting the output signal of the drive circuit 111. In the alternative, when a count of the counter for counting the output signal of the drive circuit 111 reaches a predetermined value, the FET Q31 (or overheat shutting off FET QS) is turned on to turn off (off control the FET QA.

In the circuit arrangement of the power supply control device of each of the embodiments and their modifications, the main control FET QA, the reference FET QB, the overheat shutting off FET QS, and FETs Q1 to Q31 and Q51 to Q54 are of the n-channel type, and other FETs are of the p-channel type. It is evident that the conductivity types of those transistors may be reversed, as a matter of course. In this case, the circuit must be modified such that the gate potentials for turning on and off the respective switching elements are reversed in terms of the logic level, "L" level and "H" level. The same thing is true for such a modification that the NPN type of the bipolar transistor is changed to the PNP type, and vice versa. If required, IGBT (insulated gate bipolar transistor) may be used in lieu of the main control FET QA and the reference FET QB.

As seen from the foregoing description, in the power supply control device and method of the invention, when the supply of electric power from the power supply to the load is controlled by the semiconductor switch in a switching manner, a reference current is generated by the Reference current generating device (reference current generating step). A reference voltage is generated based on the reference current by the reference voltage generating device (reference voltage generating step). A difference between the voltage between terminals of the semiconductor switch and the reference voltage is detected by the detector (detecting step). The semiconductor switch is on/off controlled in accordance with the detected voltage difference between the terminal-terminal voltage and the reference voltage by the control means (control step). The reference voltage generating device includes a second semiconductor switch controlled in accordance with the control signal. Further, the second semiconductor is connected in series to the reference current generating device to form a series circuit. The series circuit is connected in parallel to the semiconductor switch and the load. The terminal-terminal voltage of the second semiconductor switch is generated in the form of the reference voltage. The reference current generating device generates a reference current dependent on an output voltage of the power supply, or is a constant current source, as in the fourth power supply control device. Judgement is made as to whether or not the terminal-terminal voltage of the semiconductor switch (or the current in the power supply path), which forms a part of the power supply path, is out of a normal state by detecting a difference between the terminal-terminal voltage of the semiconductor switch and the reference voltage generated by the reference voltage generating device (reference voltage generating step). The power supply control device and method of the invention does not need the shunt resistor, conventionally used, which is connected in series to the power supply path for the current detection. With this feature, the heat loss of the device is suppressed. An abnormal current by a layer short, such as an imperfect short having some short resistance, as well as an overcurrent by a perfect short, can continuously be detected by use of the hardware circuit or the program processing by the MICROCOMPUTER or the like. Particularly, when the on/off control process for the semiconductor switch is realized by a hardware circuit, there is no need of using the MICROCOMPUTER. This feature brings about the packaging space reduction, and considerable reduction of the device cost.

What is claimed is:

1. A power supply control device comprising:
    a first semiconductor switch which controls a supply of electric power from a power supply to a load in accordance with a control signal;
    a reference current generating device which generates a reference current;
    a reference voltage generating device which generates a reference voltage based on said reference current;
    a detector which detects a difference between a voltage between terminals of said first semiconductor switch and said reference voltage; and
    a controller which controls on/off state of said first semiconductor switch in accordance with said detected difference.

2. A power supply control device according to claim 1, wherein said reference voltage generating device includes a second semiconductor switch controlled in accordance with said control signal, said second semiconductor switch is connected in series to said reference current generating device to form a series circuit which is connected in parallel to said first semiconductor switch and said load so that a voltage between terminals of said second semiconductor switch is generated as said reference voltage.

3. A power supply device according to claim 1, wherein said reference current depends on an output voltage of said power supply.

4. A power supply device according to claim 1, wherein said reference current generating device is a constant current source.

5. A power supply device according to claim 1, wherein a voltage characteristic of said reference voltage is substantially equal to a voltage characteristic in a state that a current which is in excess of a maximum current within a range where said first semiconductor switch and said load are normally operated flows.

6. A power supply control device according to claim 2, wherein said first and second semiconductor switch are equivalent to each other in a transient voltage characteristic of said voltage between said terminals of said first and second semiconductor switches when each said first and second semiconductor switch shifts its state from said off state to said on state.

7. A power supply control device according to claim 1 further comprising an overheat protector which turns off said first semiconductor switch when said semiconductor switch is overheat.

8. A power supply control device according to claim 1 further comprising a prohibiting device which prohibits said controller from turning on and off said first semiconductor switch for a predetermined period after said first semiconductor switch is turned on.

9. A power supply control device according to claim 1 further comprising a number-of-times controller which counts a number of times that said controller turns on and off said first semiconductor switch, said number-of-times controller turns off said first semiconductor switch when said number of times reaches a predetermined number of times.

10. A power supply control device according to claim 1, wherein said first semiconductor switches, said reference voltage generator, said detector, and said controller are formed on a same chip.

11. A power supply control device according to claim 10, wherein said reference current generator is located outside said chip.

12. A power supply control device according to claim 7, wherein said first semiconductor switches, said reference voltage generator, said detector, said controller, and said overheat protector are formed on a same chip.

13. A power supply control device according to claim 12, wherein said reference current generator is located outside said chip.

14. A power supply control method of power supply device including a semiconductor switch controlled in accordance with a control signal to control a supply of electric power from a power supply to a load, said power supply control method comprising the steps of:

generating a reference current;

generating a reference voltage based on said reference current;

detecting a difference between a voltage between terminals of said semiconductor switch and said reference voltage; and controlling on/off state of said semiconductor switch in accordance with said detected difference.

* * * * *